United States Patent
Suzuki et al.

(10) Patent No.: US 9,129,745 B2
(45) Date of Patent: Sep. 8, 2015

(54) LAMINATED CERAMIC ELECTRONIC COMPONENT AND METHOD FOR PRODUCING LAMINATED CERAMIC ELECTRONIC COMPONENT

(75) Inventors: Shoichiro Suzuki, Yasu (JP); Koichi Banno, Yasu (JP); Masahiro Otsuka, Yasu (JP); Masanori Nakamura, Izumo (JP); Seiichi Jono, Echizen (JP); Taisuke Kanzaki, Omihachiman (JP); Akihiro Shiota, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 572 days.

(21) Appl. No.: 12/888,442

(22) Filed: Sep. 23, 2010

(65) Prior Publication Data

US 2011/0075318 A1    Mar. 31, 2011

(30) Foreign Application Priority Data

Sep. 30, 2009  (JP) ................................. 2009-226823
Jun. 29, 2010  (JP) ................................. 2010-147792

(51) Int. Cl.
*H01G 4/005* (2006.01)
*H01G 4/008* (2006.01)
(Continued)

(52) U.S. Cl.
CPC .............. *H01G 4/0085* (2013.01); *H01C 7/008* (2013.01); *H01C 7/18* (2013.01); *H01G 4/1209* (2013.01); *H01G 4/30* (2013.01); *H01L 41/0471* (2013.01); *H01L 41/0477* (2013.01)

(58) Field of Classification Search
CPC ......... H01G 4/30; H01G 4/008; H01G 4/005; H01G 9/04; H01G 9/045; H01G 9/07; H01L 28/40; Y02E 60/13; C04B 2235/3217; Y02T 10/7022; Y10S 977/81

USPC ......... 361/303, 305, 306.3, 313, 321.2, 321.4
See application file for complete search history.

(56) References Cited

U.S. PATENT DOCUMENTS 5,702,807 A    12/1997  Horiuchi et al.
5,933,318 A *  8/1999  Tomono et al. ............... 361/323
(Continued)

FOREIGN PATENT DOCUMENTS

CN        1500281 A      5/2004
CN      101354935 A      1/2009
(Continued)

OTHER PUBLICATIONS

Official Communication issued in corresponding Korean Patent Application No. 10-2010-0091027, mailed on Oct. 19, 2011.
(Continued)

*Primary Examiner* — Robert J Hoffberg
*Assistant Examiner* — Hung Dang
(74) *Attorney, Agent, or Firm* — Keating & Bennett, LLP

(57) ABSTRACT

A laminated ceramic electronic component has a variety of superior mechanical properties and electrical properties, including a high degree of freedom in the design for ceramic materials, and can be manufactured at low cost and with a low percentage of defective products. The laminated ceramic electronic component includes a laminate including a plurality of stacked ceramic layers and a plurality of internal electrodes containing Al as a main constituent, the internal electrodes being arranged along specific interfaces between the ceramic layers, and external electrodes located on an outer surface of the laminate, wherein surface layer sections of the internal electrodes include an $Al_2O_3$ layer.

6 Claims, 1 Drawing Sheet

(51) Int. Cl.
  *H01C 7/00* (2006.01)
  *H01C 7/18* (2006.01)
  *H01G 4/12* (2006.01)
  *H01G 4/30* (2006.01)
  *H01L 41/047* (2006.01)

(56) References Cited

U.S. PATENT DOCUMENTS

| | | | |
|---|---|---|---|
| 6,400,553 B2 * | 6/2002 | Yoshii et al. | 361/321.2 |
| 6,590,762 B2 * | 7/2003 | Greenwood et al. | 361/523 |
| 7,042,706 B2 * | 5/2006 | Nagai et al. | 361/305 |
| 7,324,324 B2 * | 1/2008 | Sugimoto et al. | 361/303 |
| 8,009,012 B2 * | 8/2011 | Kajino et al. | 338/309 |
| 2004/0090721 A1 | 5/2004 | Nagai et al. | |
| 2006/0132280 A1 | 6/2006 | Kirsten | |
| 2007/0236108 A1 | 10/2007 | Nishimura | |
| 2009/0027158 A1 | 1/2009 | Kajino et al. | |
| 2011/0075318 A1 | 3/2011 | Suzuki et al. | |

FOREIGN PATENT DOCUMENTS

| | | |
|---|---|---|
| DE | 197 19 174 A1 | 11/1998 |
| JP | 56-6417 A | 1/1981 |
| JP | 62-35697 A | 2/1987 |
| JP | 62-137805 A | 6/1987 |
| JP | 3-233805 A | 10/1991 |
| JP | 6-84608 A | 3/1994 |
| JP | 06084608 A * | 3/1994 ............... H01C 7/02 |
| JP | 07-245482 A | 9/1995 |
| JP | 2002-261345 A | 9/2002 |
| JP | 2006-253286 A | 9/2006 |
| JP | 2011-097016 A | 5/2011 |
| WO | 97/48111 A1 | 12/1997 |
| WO | 03/092019 A1 | 11/2003 |
| WO | 2007/052599 A1 | 5/2007 |

OTHER PUBLICATIONS

Official Communication issued in corresponding Chinese Application 2010102735979, issued on Mar. 21, 2012.
Official Communication issued in corresponding European Patent Application No. 12171530.4, mailed on Aug. 8, 2012.
Official Communication issued in corresponding European Patent Application No. 10 173 157.8, mailed on Apr. 11, 2012.
Official Communication issued in corresponding European Patent Application No. 10173157.8, mailed on Jan. 12, 2011.
Kwon et al., "Microwave Dielectric Properties and Low-Temperature Cofiring of BaTe4O9 with Aluminum Metal Electrode", Journal of the American Ceramic Society, 2005, pp. 3419-3422, vol. 88, No. 12.
Official Communication issued in corresponding Japanese Patent Application No. 2010-147792, mailed on Feb. 19, 2013.

* cited by examiner

LAMINATED CERAMIC ELECTRONIC COMPONENT AND METHOD FOR PRODUCING LAMINATED CERAMIC ELECTRONIC COMPONENT

BACKGROUND OF THE INVENTION

1. Field of the Invention

The present invention relates to a laminated ceramic electronic component typified by a laminated ceramic capacitor, for example, and more particularly, relates to a laminated ceramic electronic component including an internal electrode containing Al as its main constituent.

2. Description of the Related Art

With reference to FIG. 1, a laminated ceramic capacitor 1 will be described first which is a typical example of a laminated ceramic electronic component.

The laminated ceramic capacitor 1 includes a laminate 2 composed of a plurality of stacked dielectric ceramic layers 3 and a plurality of internal electrodes 4 and 5 formed along specific interfaces between the dielectric ceramic layers 3.

First and second external electrodes 8 and 9 are formed in different positions from each other on the outer surface of the laminate 2. The laminated ceramic capacitor 1 shown in FIG. 1 has the first and second external electrodes 8 and 9 formed on respective end surfaces 6 and 7 of the laminate 2 opposed to each other, respectively. The internal electrodes 4 and 5 include a plurality of first internal electrodes 4 electrically connected to the first external electrode 8 and a plurality of second internal electrodes 5 electrically connected to the second external electrode 9, and these first and second internal electrodes 4 and 5 are alternately arranged with respect to the staking direction.

Since reduction in size is required, in particular, for laminated ceramic capacitors, an approach in which green sheets of a dielectric ceramic and internal electrode layers are stacked and then fired simultaneously is employed in the production process. In recent years, for the purpose of cost reduction, a base metal such as Ni has been used for internal electrodes of laminated ceramic capacitors.

However, since Ni is very likely to be oxidized in a co-firing process with the ceramic, it has been necessary to bring the atmosphere for firing into a reducing atmosphere and precisely control the temperature condition and the oxygen partial pressure. As a result, the material design is limited significantly. In addition, problems such as delamination and cracks have occurred and are caused by non-uniform stress associated with the co-firing.

Therefore, in order to increase the degree of freedom in the design of laminated ceramic electronic components, it is preferable to study internal electrodes made from a variety of metal materials.

For example, DE 19719174 A1 discloses a laminated ceramic body employing Al as an internal electrode material instead of Ni. However, since the melting point of Al is about 660° C., the ceramic has to be able to be sintered at about 660° C. in terms of the conventional rule of common sense. Thus, the laminated ceramic body has a problem in that the degree of freedom in the design of ceramic materials is limited significantly.

However, the laminated ceramic electronic component disclosed in DE 19719174 A1 has a problem in that the Al internal electrode is made into a spherical shape, resulting in an inability to secure sufficient conductivity, because the firing temperature is 1200° C. which is much higher than the melting point of Al at 660° C.

Furthermore, the laminated ceramic electronic component disclosed in DE 19719174 A1 has a problem in that the Al to define the internal electrodes is changed to an aluminum nitride (AlN), resulting in the inability to secure sufficient conductivity, because the firing atmosphere is a nitrogen atmosphere with an oxygen partial pressure of $10^{-5}$ atm.

SUMMARY OF THE INVENTION

Therefore, preferred embodiments of the present invention provide a laminated ceramic electronic component which includes a superior Al internal electrode in terms of smoothness and conductivity and has superior mechanical properties and electrical properties.

According to a preferred embodiment of the present invention, a laminated ceramic electronic component includes a laminate including a plurality of stacked ceramic layers and a plurality of internal electrodes containing Al as their main constituent, the internal electrodes being arranged along specific interfaces between the ceramic layers, and external electrodes disposed on an outer surface of the laminate, wherein surface layer sections of the internal electrodes include an $Al_2O_3$ layer. The thickness of the $Al_2O_3$ layer is preferably about 0.25% to about 10%, and more preferably about 0.5% to about 10% of the thickness of one of the internal electrodes, for example.

According to another preferred embodiment of the present invention, a method for producing a laminated ceramic electronic component including an internal electrode containing Al as its main constituent, includes the steps of preparing a raw laminate including a plurality of stacked ceramic green sheets and a plurality of metal constituent containing layers containing Al as their main constituent, the layers being formed along specific interfaces between the ceramic green sheets, and firing the raw laminate at a temperature of about 600° C. to about 1000° C. under an atmosphere with an oxygen partial pressure of about $1 \times 10^{-4}$ MPa or more.

According to various preferred embodiments of the present invention, laminated ceramic electronic components can be provided which have superior mechanical properties and electrical properties since the Al internal electrodes are superior in terms of smoothness and conductivity.

In addition, according to various preferred embodiments of the present invention, laminated ceramic electronic components can be provided which have a high degree of dimensional accuracy, since the $Al_2O_3$ layer constituting the surface layer of the Al internal electrode adheres tightly to the ceramic layer which may have a variety of compositions, thereby preventing shrinkage in the planar direction during a firing process.

In addition, according to various preferred embodiments of the present invention, laminated ceramic electronic components can be provided which have a variety of properties at low cost and at a low percentage defective, since the firing process is possible at a higher temperature than the melting point of Al in an atmosphere indicating an oxygen partial pressure close to that in the air, thereby increasing the degree of freedom in the design of ceramic materials.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
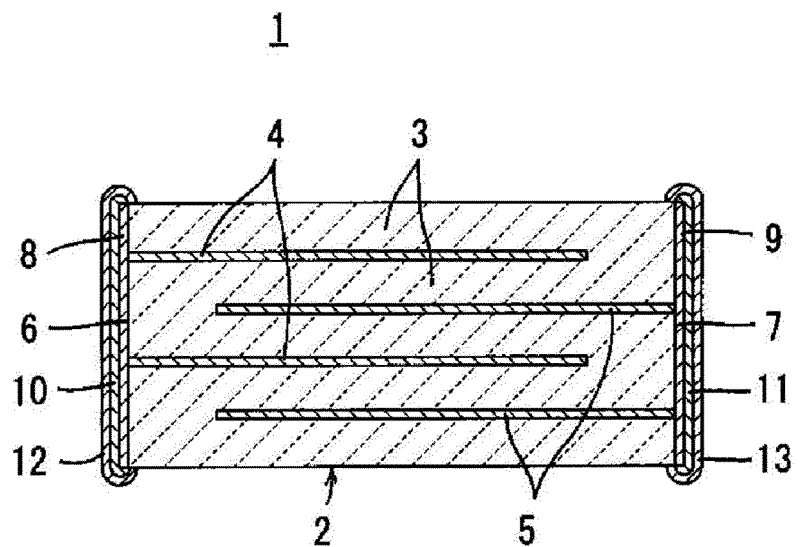
FIG. 1 is a view illustrating a laminated ceramic capacitor as an example of a laminated ceramic electronic component according to a preferred embodiment of the present invention.

A laminated ceramic electronic component according to a preferred embodiment of the present invention includes internal electrodes containing Al as their main constituent. Although the internal electrodes may be an Al element or an Al alloy, the content rate of Al is preferably about 70 mol %, and more preferably about 90 mol % or more in the case of an Al alloy, for example.

The surface layer sections of the internal electrodes, that is, the sections in contact with the ceramic layers include a layer containing $Al_2O_3$ as its main constituent. This mainly arises from the oxidized surfaces of the Al internal electrodes. This $Al_2O_3$ layer prevents the electrodes from being broken due to the Al internal electrodes being made into a spherical shape, and keeps the conductivity of the Al internal electrodes favorable. In addition, this $Al_2O_3$ layer acts to smooth the Al internal electrode layers, thereby preventing delamination between the ceramic layer and the Al internal electrode and also preventing the laminate from cracking. In order to bring about this effect, the thickness of the $Al_2O_3$ layer is preferably about 0.25% or more of the thickness of the internal electrode, for example. Furthermore, when the thickness of the $Al_2O_3$ layer is about 0.5% or more, the effect described is achieved more reliably.

In addition, when the thickness of the $Al_2O_3$ layer is greater than about 10% of the thickness of the internal electrode, more than about 20% of the total thickness of the internal electrode layers will be composed of $Al_2O_3$, resulting in concerns about decrease in conductivity. Therefore, the thickness of the $Al_2O_3$ layer is preferably about 10% or less of the thickness of the internal electrode, for example.

Next, a method for producing a laminated ceramic electronic component according to a preferred embodiment the present invention will be described with a laminated ceramic capacitor as an example.

First, a ceramic raw material is prepared. This ceramic raw material is mixed with an organic binder component in a solvent, if necessary, to obtain a ceramic slurry. This ceramic slurry is subjected to sheet forming to obtain ceramic green sheets.

Next, an internal electrode containing Al as its main component is formed onto the ceramic green sheets. While there are several methods for the formation of the internal electrode, a simple method in which an Al paste including an Al powder and an organic vehicle is applied by screen printing into a desirable pattern may preferably be used. In addition, also available are a method of transferring Al metal foil and a method of forming an Al film while carrying out masking in accordance with a vacuum thin-film formation method.

In this way, a raw laminate which has not been fired yet is obtained by stacking multiple layers of ceramic green sheets and Al internal electrode layers, followed by pressure bonding.

This raw laminate is fired in a firing furnace at a predetermined temperature in a predetermined atmosphere. For example, in the case of an oxygen partial pressure of about $1 \times 10^{-4}$ MPa or more and a firing temperature of about 600° C. or more for firing, the surfaces of the Al internal electrodes are progressively oxidized to form an $Al_2O_3$ layer with a moderate thickness. Preferably, the firing temperature set to the melting point of Al or more, for example, about 670° C. or more forms an $Al_2O_3$ layer with a moderate thickness in a more reliable and stable manner.

In addition, for example, when the firing temperature is set to about 1000° C. or less, the Al internal electrodes are prevented effectively from being made into a spherical shape. The oxygen partial pressure is most preferably an atmospheric pressure in view of simplicity of the process.

In addition, when the rate of temperature increase from room temperature to the TOP temperature is set to about 100° C./min or more in the firing step, the $Al_2O_3$ layer is more likely to be formed at the surface layers of the Al internal electrodes with more certainty, even when various changes are made to the composition of the ceramic material and the design of the laminated structure. This is believed to be because the formation of the $Al_2O_3$ layer at the surface layers and firing of the ceramic are caused before the fluidity of Al arising from melted Al is increased.

It is to be noted that while the melting point of Al is about 660° C., the production method according to a preferred embodiment of the present invention allows co-firing along with the ceramic even at temperatures much higher than about 660° C. This is believed to be because of the $Al_2O_3$ layers formed at the surface layer sections of the Al internal electrodes. Therefore, a high degree of freedom is offered in the design for the material composition of the ceramic used, thereby allowing for application to a variety of applications.

It is to be noted that the ceramic composition is not particularly limited in the laminated ceramic electronic component according to a preferred embodiment of the present invention. A variety of materials can be applied within the scope of the present invention so as not to interfere with the advantages achieved by preferred embodiments of the present invention, such as barium titanate series (including barium titanates substituted with Ca, Sr, Zr, or the like), lead titanate series or lead zirconate titanate series, alumina-based glass ceramic, ferrite, transition element oxide-based semiconductor ceramics.

In addition, the laminated ceramic electronic component according to a preferred embodiment of the present invention can be applied to not only laminated ceramic capacitors, but also a variety of electronic components such as laminated piezoelectric elements, laminated thermistor elements, laminated chip coils, and ceramic multi-layer substrates.

EXAMPLES

Example 1

The present example is intended to examine the dependence on the presence or absence and thickness of an $Al_2O_3$ layer in laminated ceramic electronic components which have six different types of ceramic compositions and Al internal electrodes.

First, a $BaTiO_3$ powder was prepared as a main constituent of a ceramic, and $Bi_2O_3$, CuO, $B_2O_3$, BaO, and $SiO_2$ powders were prepared as accessory constituents. These powders were mixed so as to satisfy the six types of content rates shown in Table 1, thereby providing six types of ceramic raw materials.

TABLE 1

| Composition | $BaTiO_3$ (mol %) | $Bi_2O_3$ (mol %) | CuO (mol %) | $B_2O_3$ (mol %) | BaO (mol %) | $SiO_2$ (mol %) |
|---|---|---|---|---|---|---|
| 1-1 | 90 | 9 | 1 | 0 | 0 | 0 |
| 1-2 | 90 | 7 | 3 | 0 | 0 | 0 |
| 1-3 | 90 | 8 | 0 | 0 | 2 | 0 |

TABLE 1-continued

| Composition | BaTiO$_3$ (mol %) | Bi$_2$O$_3$ (mol %) | CuO (mol %) | B$_2$O$_3$ (mol %) | BaO (mol %) | SiO$_2$ (mol %) |
|---|---|---|---|---|---|---|
| 1-4 | 90 | 8 | 0 | 2 | 0 | 0 |
| 1-5 | 50 | 25 | 0 | 0 | 0 | 25 |
| 1-6 | 50 | 35 | 0 | 0 | 0 | 15 |

An ethanol-based organic solvent and a polyvinyl butyral based binder were added to each of these ceramic raw materials, followed by wet mixing in a ball mill, to obtain ceramic slurries. The ceramic slurries were subjected to sheet forming to obtain ceramic green sheets.

Next, an Al paste including an Al powder and an organic vehicle was applied by screen printing onto the ceramic green sheets to form Al paste layers. The ceramic green sheets with the Al paste applied were stacked so that the sides to which the Al paste layers were drawn were alternated, followed by pressure bonding, thereby providing raw laminates.

The raw laminates were heated at about 270° C. in the air to remove the binder. After this, the temperature was increased at a rate of temperature increase of about 100° C./min, and the laminates were fired in the air at the firing temperatures shown in Table 2 for approximately 1 minute. An Ag paste containing low melting point glass frit was applied onto the both end surfaces of the obtained laminates, and fired at about 600° C. in the air to obtain external electrodes connected to internal electrodes.

The laminated ceramic capacitors thus obtained were approximately 2.0 mm in length, 1.0 mm in width, and 0.5 mm in thickness, and 50 μm in thickness for each ceramic layer and 5 μm in thickness for each internal electrode layer, and the number of effective layers was 5, for example.

For the obtained samples, the capacitance and dielectric loss (tan δ) were measured with an automatic bridge-type measurement device. The results are shown in Table 2.

In addition, cross sections subjected to FIB processing were analyzed with μ-SAM, to identify Al$_2$O$_3$ in the cross sections of the internal electrodes. The thickness of the Al$_2$O$_3$ layer was measured at 10 arbitrary points to calculate the ratio of the average value for the 10 points to 5 μm. The results are shown in Table 2.

TABLE 2

| Composition | Firing Temperature (° C.) | Oxygen Partial Pressure (MPa) | Capacitance (pF) | Tan δ (%) | Al$_2$O$_3$ Layer Thickness (%) |
|---|---|---|---|---|---|
| 1-1 | 700 | $2 \times 10^{-2}$ | 1557 | 6.8 | 2.0 |
|  | 800 | $2 \times 10^{-2}$ | 1053 | 5.2 | 4.0 |
|  | 900 | $1 \times 10^{-5}$ | — | — | — |
|  | 900 | $1 \times 10^{-4}$ | 1608 | 5.2 | 2.0 |
|  | 900 | $1 \times 10^{-3}$ | 908 | 4.8 | 5.0 |
|  | 900 | $2 \times 10^{-2}$ | 711 | 3.2 | 7.0 |
|  | 900 | $1 \times 10^{-1}$ | 538 | 3.2 | 10 |
|  | 1000 | $2 \times 10^{-2}$ | 549 | 2.3 | 10 |
|  | 1100 | $2 \times 10^{-2}$ | — | — | 11 |
| 1-2 | 700 | $2 \times 10^{-2}$ | 1489 | 6.5 | 2.0 |
|  | 800 | $2 \times 10^{-2}$ | 1022 | 5.6 | 4.0 |
|  | 900 | $2 \times 10^{-2}$ | 706 | 4.3 | 7.0 |
| 1-3 | 800 | $2 \times 10^{-2}$ | 1089 | 5.6 | 4.0 |
|  | 900 | $2 \times 10^{-2}$ | 739 | 4.1 | 7.0 |
|  | 1000 | $2 \times 10^{-2}$ | 543 | 2.9 | 10 |
|  | 1100 | $2 \times 10^{-2}$ | — | — | 11 |
| 1-4 | 800 | $2 \times 10^{-2}$ | 1091 | 4.9 | 4.0 |
|  | 900 | $2 \times 10^{-2}$ | 703 | 3.8 | 7.0 |
|  | 1000 | $2 \times 10^{-2}$ | 501 | 2.8 | 10 |
|  | 1100 | $2 \times 10^{-2}$ | — | — | 11 |
| 1-5 | 500 | $2 \times 10^{-2}$ | — | — | 0.2 |
|  | 600 | $2 \times 10^{-2}$ | 703 | 0.8 | 0.25 |
|  | 670 | $2 \times 10^{-2}$ | 682 | 0.6 | 0.5 |
|  | 700 | $2 \times 10^{-2}$ | 606 | 0.2 | 2.0 |
|  | 800 | $2 \times 10^{-2}$ | 523 | 0.2 | 4.0 |
| 1-6 | 500 | $2 \times 10^{-2}$ | — | — | 0.2 |
|  | 600 | $2 \times 10^{-2}$ | 712 | 0.8 | 0.25 |
|  | 680 | $2 \times 10^{-2}$ | 666 | 0.5 | 0.8 |
|  | 700 | $2 \times 10^{-2}$ | 608 | 0.2 | 2.0 |
|  | 800 | $2 \times 10^{-2}$ | 504 | 0.2 | 4.0 |

The results in Table 2 show that among the laminates using the six types of ceramic compositions 1-1 to 1-6, the samples with the Al$_2$O$_3$ layer accounting for about 0.25% to about 10% in terms of thickness formed at the surface layer sections of the Al internal electrodes had no electrodes made into a spherical shape, thereby providing superior laminates in terms of conductivity and smoothness, and thus providing desired capacitances.

On the other hand, when the oxygen partial pressure was too low, about $1 \times 10^{-5}$ MPa, the Al of the internal electrodes was nitrided, thereby increasing the resistance value, and then resulting in the inability to obtain required conductivity.

In addition, the samples with the Al$_2$O$_3$ layer accounting for a ratio less than about 0.25% in terms of thickness because of the low firing temperature of about 500° C. were inferior in terms of the smoothness of the Al internal electrodes, and insufficiently served as internal electrodes.

Furthermore, the samples with the Al$_2$O$_3$ layer accounting for a ratio greater than about 10% in terms of thickness because of the too high firing temperature of about 1100° C. provided insufficient conductivity due to increase in resistance value.

Example 2

The present example is intended to examine the influence in the case of changing internal electrodes from Ni to Al in a certain dielectric ceramic material.

First, a ceramic raw material represented by the composition formula 100(Ba$_{0.95}$Ca$_{0.05}$)$_{1.01}$TiO$_3$+0.2 Dy$_2$O$_3$+0.1 MnO+0.6 MgO+2.0 SiO$_2$+0.5 Li$_2$O was prepared.

This ceramic raw material was used to obtain ceramic green sheets in the same way as in Example 1. In parallel, an Al paste including an Al metal powder and an organic vehicle and a Ni paste including a Ni metal powder and an organic vehicle were prepared.

Next, the Al paste was applied by screen printing onto the ceramic green sheets to form Al paste layers. The ceramic green sheets with the Al paste applied were stacked so that the sides to which the Al paste layers were drawn were alternated, followed by pressure bonding, thereby providing a raw laminate. In the same way, a raw laminate was obtained in the case of using the Ni paste.

The raw laminates were heated at about 270° C. in the air to remove the binder. After this, the temperature was increased at a rate of temperature increase of about 100° C./min, and the laminates were fired at about 1000° C., for example. In this way, samples of the laminates were obtained.

The thus obtained laminates were about 2.0 mm in length, about 1.0 mm in width, and about 0.5 mm in thickness, and the number of effective layers was 5, for example. An Al$_2$O$_3$ layer was formed at surface layer sections of the Al internal electrodes.

Then, the area of the internal electrode per layer of the laminate was measured to obtain the ratio to the area of the internal electrode in the raw laminate before the firing, that is, the area shrinkage ratio in the planar direction of the internal electrode. Table 3 shows the results.

Furthermore, the thickness of the ceramic layer was measured to obtain the ratio to the thickness of the ceramic layer in the raw laminate before the firing, that is, the shrinkage ratio in the thickness direction of the ceramic layer. Table 3 shows the results.

Next, the Al paste was applied by screen printing onto the ceramic green sheets from the raw material 3-1 to 3-4 to form Al paste layers. The ceramic green sheets with the Al paste applied were stacked so that the sides to which the Al paste layers were drawn were alternated, followed by pressure bonding, thereby providing a raw laminate. In the same way, raw laminates were also obtained in the case of using the Ni paste for the ceramic green sheets from the raw material 3-5 and in the case of using the Cu paste for the ceramic green sheets from the raw material 3-6. As for the number of stacked

TABLE 3

| Sample Number | Main Constituent of Internal Electrode | Area of Internal Electrode before Firing (mm$^2$) | Area of Internal Electrode after Firing (mm$^2$) | Area Shrinkage Ratio in Planar Direction of Internal Electrode (%) | Thickness of Ceramic Layer before Firing (μm) | Thickness of Ceramic Layer after Firing (μm) | Shrinkage Ratio in Thickness Direction of Ceramic Layer (%) |
|---|---|---|---|---|---|---|---|
| 2-1 | Al | 2.47 | 2.02 | 82 | 18 | 10 | 56 |
| 2-2 | Ni | 2.89 | 1.74 | 60 | 18 | 13 | 74 |

When the laminate with the Al internal electrodes is compared with the laminate with the Ni internal electrodes, it has been determined that the Al internal electrodes are less likely to be shrunk than the Ni internal electrodes. On the other hand, the shrinkage ratio in the thickness direction of the ceramic layer is higher in the case of the laminate with the Al internal electrodes. This is believed to be because the Al internal electrodes constrained shrinkage in the planar direction of the ceramic layer during the firing process.

According to the results described above, the use of Al for the internal electrodes allows laminates including thin ceramic layers suitable for high capacitance products to be obtained even when the ceramic green sheets are made relatively thick. Therefore, defects such as pinholes can be expected to be reduced. Accordingly, the laminate with the Al internal electrodes is useful as laminated ceramic capacitors which have to made thinner and thinner.

Example 3

The present example is intended to evaluate laminates including Al internal electrodes with a variety of compositions as ceramic compositions for firing at low temperatures.

First, respective starting raw materials were mixed so as to satisfy the compositions shown in Table 4, thereby providing ceramic raw materials of six types of compositions, raw materials 3-1 to 3-6.

TABLE 4

| Raw Material | Bi$_2$O$_3$ (mol %) | SiO$_2$ (mol %) | CaZrO$_3$ (mol %) | B$_2$O$_3$ (mol %) | PbO (mol %) | Al$_2$O$_3$ (mol %) | TeO$_2$ (mol %) |
|---|---|---|---|---|---|---|---|
| 3-1 | 65 | 35 | | | | | |
| 3-2 | 75 | | | 25 | | | |
| 3-3 | | 30 | | | 70 | | |
| 3-4 | | | | | | 10 | 90 |
| 3-5 | | 2 | 98 | | | | |
| 3-6 | | 1.5 | 97 | 1.5 | | | |

The ceramic raw materials were used to obtain ceramic green sheets in the same way as in Example 1. In parallel, an Al paste including an Al metal powder and an organic vehicle, a Ni paste including a Ni metal powder and an organic vehicle, and a Cu paste including a Cu metal powder and an organic vehicle were prepared.

layers, three types of 5 layers, 30 layers, and 100 layers were prepared respectively as shown in Table 5.

The raw laminates were heated at about 270° C. in the air to remove the binder. After this, the temperature was increased at a rate of temperature increase of about 100° C./min, and the laminates were fired at the temperature shown in Table 5 for 1 minute. An Ag paste containing low melting point glass frit was applied onto the both end surfaces of the obtained laminates, and fired at about 600° C. in the air to obtain external electrodes connected to internal electrodes. In this way, samples were obtained.

Figure 2:
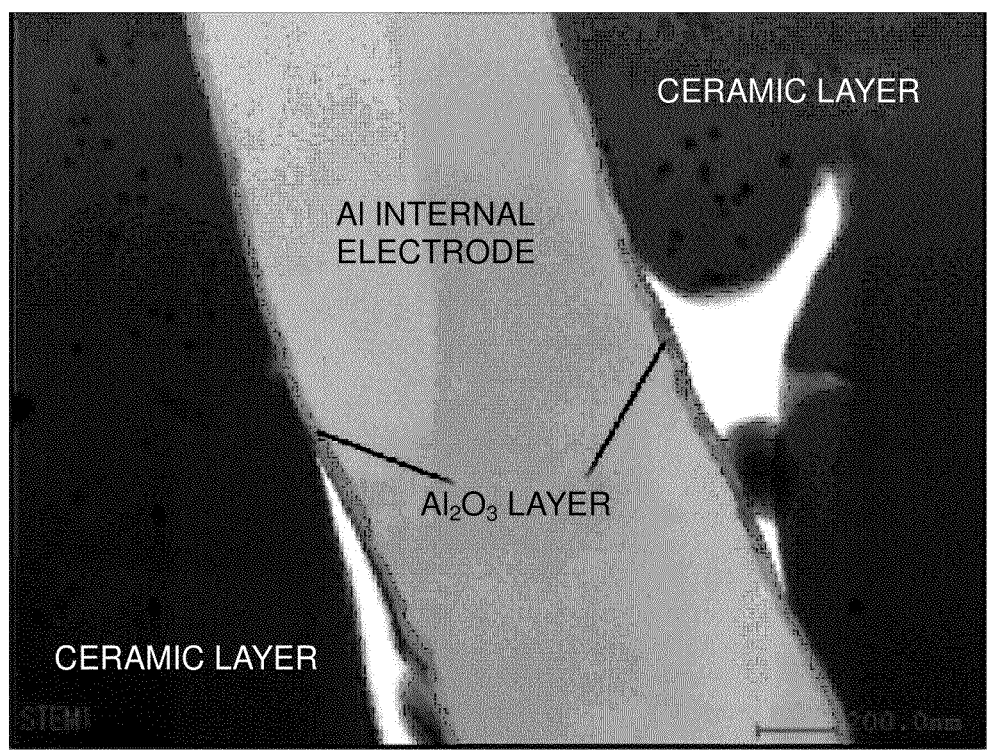
FIG. 2 is an enlarged photograph in the vicinity of an Al internal electrode of a laminate according to Example 3 of a preferred embodiment of the present invention.

The thus obtained laminates were about 2.0 mm in length, about 1.0 mm in width, and about 0.5 mm in thickness. The effective area per layer was about $1.7 \times 10^{-6}$ m$^2$. The thickness per ceramic layer was about 5 μm. An Al$_2$O$_3$ layer was formed at surface layer sections of the Al internal electrodes of the laminates 3-1 to 3-4 using the Al paste. FIG. 2 shows a magnified photograph in the vicinity of the Al internal electrode of the sample 3-1.

For the six types of samples obtained, the dielectric constant was measured with an automatic bridge-type measurement device. In addition, the insulation resistivity log ρ (Ω·m) in the case of applying a voltage of 5 kV/mm for 1 minute was measured. The results are shown in Table 5.

Furthermore, the six types of samples, 30 pieces for each sample, were subjected to an ultrasonic inspection to confirm the presence or absence of cracks. The results are shown in Table 5.

TABLE 5

| Raw Material | Internal Electrode | Firing Temperature (° C.) | The Number of Staked Layers | The number of crack defects | ε | Log ρ (Ω·m) |
|---|---|---|---|---|---|---|
| 3-1 | Al | 600 | 5 | 0 | 33 | 11.8 |
|  |  |  | 30 | 0 | 33 | 11.8 |
|  |  |  | 100 | 0 | 33 | 11.8 |
| 3-2 | Al | 600 | 5 | 0 | 37 | 11.4 |
|  |  |  | 30 | 0 | 37 | 11.4 |
|  |  |  | 100 | 0 | 37 | 11.4 |
| 3-3 | Al | 600 | 5 | 0 | 30 | 11.9 |
|  |  |  | 30 | 0 | 30 | 11.9 |
|  |  |  | 100 | 0 | 30 | 11.9 |
| 3-4 | Al | 600 | 5 | 0 | 45 | 11.4 |
|  |  |  | 30 | 0 | 45 | 11.4 |
|  |  |  | 100 | 0 | 45 | 11.4 |

TABLE 5-continued

| Raw Material | Internal Electrode | Firing Temperature (°C.) | The Number of Staked Layers | The number of crack defects | ε | Log ρ (Ω·m) |
|---|---|---|---|---|---|---|
| 3-5 | Ni | 600 | 5 | 0 | 27 | 12.6 |
|  |  |  | 30 | 5 | 27 | 12.6 |
|  |  |  | 100 | 12 | 27 | 12.6 |
| 3-6 | Cu | 600 | 5 | 0 | 27 | 12.6 |
|  |  |  | 30 | 5 | 27 | 12.6 |
|  |  |  | 100 | 10 | 27 | 12.6 |

It has been determined from the results in Table 5 that when the number of stacked layers is 30 or more, the use of the Al internal electrodes significantly suppresses cracks. This is believed to be because it is possible to form the smooth internal electrodes of Al with its elastic modulus lower than Ni and Cu.

Therefore, the laminates including the Al internal electrodes have a high degree of freedom in the design such as the pattern design or laminated structure for the internal electrodes, and are thus quite useful for laminated ceramic electronic components.

Example 4

The present example provides an example of a multilayer substrate including a glass ceramic and an Al internal electrode, and is intended to be compared with Ag internal electrodes.

First, a glass powder with the composition of 43 $SiO_2$-44.9 CaO-5.7 $B_2O_3$-6.4 $Al_2O_3$ (coefficient:wt %) and an $Al_2O_3$ powder were prepared. The glass powder and the $Al_2O_3$ powder were weighed to provide a weight ratio of 48:52, and mixed to obtain a ceramic raw material powder.

This ceramic raw material was used to obtain ceramic green sheets in the same way as in Example 1. In parallel, an Al paste including an Al metal powder and an organic vehicle and an Ag paste including an Ag metal powder and an organic vehicle were prepared.

Next, the Al paste was applied by screen printing onto the ceramic green sheets to form Al paste layers. The ceramic green sheets with the Al paste applied were stacked so that the sides to which the Al paste layers were drawn were alternated, followed by pressure bonding, thereby providing a raw laminate. In the same way, a raw laminate was obtained in the case of using the Ag paste. In this case, the effective area per layer was about $1.7 \times 10^{-6}$ $m^2$, and the number of effective layers was 5, for example.

The raw laminates were heated at about 270° C. in the air to remove the binder. After this, the temperature was increased at a rate of temperature increase of about 100° C./min, and the laminates were fired at the temperature shown in Table 6 for 1 minute. An Ag paste containing low melting point glass frit was applied onto the both end surfaces of the obtained laminates, and fired at about 600° C. in the air to obtain external electrodes connected to internal electrodes. In this way, samples were obtained.

The thus obtained laminates were about 2.0 mm in length, about 1.0 mm in width, and about 0.5 mm in thickness. The thickness per ceramic layer was about 5 μm. An $Al_2O_3$ layer was formed at surface layer sections of the Al internal electrodes of the laminates 4-1 to 4-3 using the Al paste.

For the four types of samples 4-1 to 4-4 obtained, the dielectric constant was measured with an automatic bridge-type measurement device. The results are shown in Table 6.

Likewise, the effective area per layer of the internal electrodes in the laminate after the firing was measured to evaluate the area shrinkage ratio (=(Effective Area after Firing)/(Effective Area before Firing)) to the area of about $1.7 \times 10^{-6}$ $m^2$ before the firing. The results are shown in Table 6.

TABLE 6

| Sample Number | Internal Electrode | Firing Temperature (°C.) | Dielectric Constant | Shrinkage Ratio (%) |
|---|---|---|---|---|
| 4-1 | Al | 850 | 8 | 95.9 |
| 4-2 | Al | 900 | 8 | 94.2 |
| 4-3 | Al | 950 | 8 | 94.2 |
| 4-4 | Ag | 900 | 8 | 87.9 |

According to the results in Table 6, the shrinkage ratios for the samples 4-1, 4-2, and 4-3 using the Al internal electrodes were smaller than that for the sample 4-4 using the Ag internal electrodes. This is believed to be because the $Al_2O_3$ layer formed at the surface layer sections of the Al internal electrodes acted to cause the internal electrode to adhere tightly to the glass ceramic layer.

Accordingly, the laminates including the Al internal electrodes according to the present example of a preferred embodiment are useful as laminates for ceramic multilayer substrates which require a high degree of dimensional accuracy.

Example 5

The present example provides an example of a laminated NTC thermistor including a semiconductor ceramic and an Al internal electrode, and is intended to be compared with an Ag/Pd internal electrode.

First, a powder with the composition of 0.60 Mn-0.25 Ni-0.1 Fe-0.05 Ti (coefficient:molar ratio) was prepared, and used as a ceramic raw material powder.

This ceramic raw material was used to obtain ceramic green sheets in the same way as in Example 1. In parallel, an Al paste including an Al metal powder and an organic vehicle and an Ag/Pd paste including an Ag/Pd=7/3 metal powder and an organic vehicle were prepared.

Next, the Al paste was applied by screen printing onto the ceramic green sheets to form Al paste layers. The ceramic green sheets with the Al paste applied were stacked so that the sides to which the Al paste layers were drawn were alternated, followed by pressure bonding, thereby providing a raw laminate. In the same way, a raw laminate was obtained in the case of using the Ag/Pd paste. In this case, the effective area per layer was about $1.7 \times 10^{-6}$ $m^2$, and the number of effective layers was 1.

The raw laminates were heated at about 270° C. in the air to remove the binder. After this, the temperature was increased at a rate of temperature increase of about 100° C./min, and the laminates were fired at the temperature shown in Table 7 for 1 minute. An Ag paste containing low melting point glass frit was applied onto the both end surfaces of the obtained laminates, and fired at about 600° C. in the air to obtain external electrodes connected to internal electrodes. In this way, samples were obtained.

The thus obtained laminates were about 2.0 mm in length, about 1.0 mm in width, and about 0.5 mm in thickness. The thickness per ceramic layer was about 5 μm. An $Al_2O_3$ layer was formed at surface layer sections of the Al internal electrodes of the laminates 5-1 to 5-3 using the Al paste.

For the four types of samples 5-1 to 5-4 obtained, the resistance value was measured to evaluate the volume resistivity from the effective area and the thickness of the ceramic layer. The results are shown in Table 7.

Likewise, the effective area per layer of the internal electrodes in the laminate after the firing was measured to evaluate the area shrinkage ratio (=(Effective Area after Firing)/(Effective Area before Firing)) to the area of about $1.7 \times 10^{-6}$ m² before the firing. The results are shown in Table 7.

TABLE 7

| Sample Number | Internal Electrode | Firing Temperature (° C.) | Volume Resistivity (Ω · m) | Shrinkage Ratio (%) |
|---|---|---|---|---|
| 5-1 | Al | 850 | 520 | 92.5 |
| 5-2 | Al | 900 | 840 | 91.8 |
| 5-3 | Al | 950 | 390 | 90.5 |
| 5-4 | Ag/Pd | 900 | 450 | 85.2 |

According to the results in Table 7, the shrinkage ratios for the samples 5-1, 5-2 and 5-3 using the Al internal electrodes were smaller than that for the sample 5-4 using the Ag/Pd internal electrodes. This is believed to be because the $Al_2O_3$ layer formed at the surface layer sections of the Al internal electrodes acted to cause the internal electrode to adhere tightly to the ceramic layer.

Therefore, the laminates including the Al internal electrodes according to various preferred embodiments of the present invention are useful as laminates for laminated thermistors which require a high degree of dimensional accuracy and resistance value accuracy.

Example 6

The present example provides an example of a laminated chip coil including a magnetic ceramic and an Al internal electrode, and is intended to be compared with an Ag internal electrode.

First, a ceramic powder for ferrite with the composition of 0.49 $Fe_2O_3$-0.29 ZnO-0.14 NiO-0.08 CuO (coefficient:molar ratio) was prepared, and about 0.5 wt % of borosilicate glass was added to and mixed with the ceramic powder for ferrite. This mixed powder was used as a ceramic raw material powder.

This ceramic raw material was used to obtain ceramic green sheets in the same way as in Example 1. In parallel, an Al paste including an Al metal powder and an organic vehicle and an Ag paste including an Ag metal powder and an organic vehicle were prepared.

Next, after forming through holes in predetermined positions, the Al paste was applied by screen printing onto the ceramic green sheets to form a coil pattern composed of an Al paste layer. The ceramic green sheets with the Al paste applied were stacked, followed by pressure bonding, thereby providing a raw laminate with coils formed. In the same way, a raw laminate was obtained in the case of using the Ag paste.

The raw laminates were heated at about 270° C. in the air to remove the binder. After this, the temperature was increased at a rate of temperature increase of about 100° C./min, and the laminates were fired at the temperature shown in Table 8 for 1 minute. The thus obtained laminates were about 1.0 mm in length, about 0.5 mm width, and about 0.5 mm in thickness. The number of coil turns was 7.5 turns for the obtained laminates, and the line width of the coil was about 100 μm.

An Ag paste containing low melting point glass frit was applied onto the both end surfaces of the obtained laminates, and fired at about 600° C. in the air to obtain external electrodes connected to internal electrodes. It is to be noted that while the exposed surfaces of the internal electrodes are subjected to polishing by sandblasting or the like in order to provide sufficient contact between the internal electrodes and the external electrode in the case of common laminated chip coils, this polishing was not carried out in the present example.

In addition, an $Al_2O_3$ layer was formed at surface layer sections of internal electrodes of the laminates 6-1, 6-2, and 6-3 using the Al paste. In this way, samples for evaluation were obtained.

The samples 6-1, 6-2, 6-3, and 6-4 obtained as shown in Table 8, 20 pieces for each sample, were subjected to conduction check between the both external electrodes. The results of the number of conduction defects are shown in Table 8.

TABLE 8

| Sample Number | Internal Electrode | Firing Temperature (° C.) | The Number of Defects in Conduction Check |
|---|---|---|---|
| 6-1 | Al | 850 | 0/20 |
| 6-2 | Al | 900 | 0/20 |
| 6-3 | Al | 950 | 0/20 |
| 6-4 | Ag | 900 | 14/20 |

According to the result in Table 8, no conduction defects were observed in the samples 6-1, 6-2, and 6-3 using the Al internal electrodes, while a number of conduction defects were caused in the sample 6-4 using the Ag internal electrodes. This is believed to be because the $Al_2O_3$ layer formed at the surface layer sections of the Al internal electrodes caused the internal electrode to adhere tightly to the ceramic layer, thereby preventing electrode retraction arising from shrinkage of the Al internal electrode.

Therefore, the use of the Al internal electrode can eliminate the step of polishing by sandblasting or the like before the formation of the external electrodes, and reduce the potential for conduction defects. Accordingly, the laminates using the Al internal electrodes are quite useful for laminated chip coils.

Example 7

The present example is an example of a laminated piezoelectric element including a piezoelectric ceramic and an Al internal electrode, and is intended to be compared with an Ag/Pd internal electrode.

First, a powder with the composition of $(Pb_{0.88}Bi_{0.12})\{(Ni_{1/2}Nb_{1/2})_{0.15}Ti_{0.45}Zr_{0.40}\}O_3$ was prepared, and used as a ceramic raw material powder.

This ceramic raw material was used to obtain ceramic green sheets in the same way as in Example 1. In parallel, an Al paste including an Al metal powder and an organic vehicle and an Ag/Pd paste including an Ag/Pd=9/1 metal powder and an organic vehicle were prepared.

Next, the Al paste was applied by screen printing onto the ceramic green sheets to form Al paste layers. The ceramic green sheets with the Al paste applied were stacked so that the sides to which the Al paste layers were drawn were alternated, followed by pressure bonding, thereby providing a raw laminate. In the same way, a raw laminate was obtained in the case of using the Ag/Pd paste.

The raw laminates were heated at about 270° C. in the air to remove the binder. After this, the temperature was increased at a rate of temperature increase of about 100° C./min, and the laminates were fired at the temperature shown in Table 9 for 1 minute. An $Al_2O_3$ layer was formed at surface layer sections of the Al internal electrodes of the laminates using the Al paste.

An Ag paste containing low melting point glass frit was applied onto the both end surfaces of the obtained laminates, and fired at about 600° C. in the air to obtain external electrodes connected to internal electrodes.

The thus obtained laminates were about 5 mm in length, about 5 mm in width, and about 0.6 mm in thickness. In addition, the thickness per ceramic layer was about 100 μm, and the number of effective layers was 3. In this case, the (Length of Laminate after Firing)/(Length of Laminate before Firing)×100 was obtained as the shrinkage ratio (%), and the results for the shrinkage ratio are shown in Table 9. Samples 7-1 and 7-2 include Al internal electrodes, whereas samples 7-3 and 7-4 include Ag/Pd internal electrodes.

TABLE 9

| Sample Number | Internal Electrode | Firing Temperature (° C.) | Shrinkage Ratio (%) |
|---|---|---|---|
| 7-1 | Al | 900 | 95 |
| 7-2 | Al | 950 | 95 |
| 7-3 | Ag/Pd | 900 | 81 |
| 7-4 | Ag/Pd | 950 | 77 |

It has been determined that the shrinkage ratio is smaller in spite of the same firing temperature in the case of using the Al internal electrodes, as compared with the laminates using the Ag/Pd internal electrodes. Therefore, piezoelectric elements can be expected to be obtained which are superior in terms of dimensional accuracy, and are useful for laminated piezoelectric actuators and the like which require a particularly strict degree of dimensional accuracy.

In addition, in parallel, a voltage of approximately 300 V was applied at about 80° C. for about 10 minutes between the external electrodes of the laminates to carry out a polarization treatment. Then, the simplified measurement of the piezoelectric d constant provided values on the order of about 250 pC/N to about 500 pC/N in terms of piezoelectric $d_{33}$ constant for all of the samples. Therefore, it has been determined that the use of the Al internal electrodes even provides a sufficient piezoelectric property.

The laminated ceramic electronic components according to various preferred embodiments of the present invention can be applied to laminated ceramic capacitors, laminated piezoelectric elements, laminated thermistors, laminated chip coils, ceramic multilayer substrates, and the like, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A laminated ceramic electronic component comprising:
    a laminate including a plurality of stacked ceramic layers and a plurality of internal electrodes containing Al as a main constituent, the internal electrodes being arranged along specific interfaces between the ceramic layers; and
    external electrodes located on an outer surface of the laminate; wherein
    each of the plurality of internal electrodes includes surface layer sections defined by sections of the plurality of internal electrodes in contact with respective ones of the plurality of ceramic layers;
    the surface layer sections are provided continuously at all portions of the plurality of internal electrodes in contact with the plurality of ceramic layers;
    an $Al_2O_3$ layer is provided continuously at all portions of all of the surface layer sections of the plurality of internal electrodes; and
    a thickness of the $Al_2O_3$ layer is about 0.25% to about 10% of a thickness of one of the internal electrodes.

2. The laminated ceramic electronic component according to claim 1, wherein the thickness of the $Al_2O_3$ layer is about 0.5% to about 10% of the thickness of the one of the internal electrodes.

3. The laminated ceramic electronic component according to claim 1, wherein the ceramic layers contain a barium titanate based perovskite compound as a main constituent, and the laminated ceramic electronic component is a laminated ceramic capacitor.

4. The laminated ceramic electronic component according to claim 1, wherein the ceramic layers contain a lead titanate based or lead zirconate titanate based perovskite compound as a main constituent, and the laminated ceramic electronic component is a laminated piezoelectric element.

5. The laminated ceramic electronic component according to claim 1, wherein the ceramic layers include a semiconductor ceramic containing, as a main constituent, an oxide of a metal element including at least one of Mn, Ni, Fe, and Ti, and the laminated ceramic electronic component is a laminated thermistor.

6. The laminated ceramic electronic component according to claim 1, wherein the ceramic layers include a glass ceramic containing a glass constituent including Si and B and containing alumina as its main constituents, and the laminated ceramic electronic component is a ceramic multilayer substrate.

* * * * *